United States Patent
Wang et al.

(10) Patent No.: US 7,851,324 B2
(45) Date of Patent: Dec. 14, 2010

(54) METHOD OF FORMING METAL-INSULATOR-METAL STRUCTURE

(75) Inventors: Yu-Jen Wang, Hsinchu (TW); Chia-Shiung Tsai, Hsinchu (TW); Yeur-Luen Tu, Taichung (TW); Lan-Lin Chao, Sindlan (TW); Chih-Ta Wu, Hsinchu (TW); Hsing-Lien Lin, Hsinchu (TW); Chung Chien Wang, Tucheng (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 844 days.

(21) Appl. No.: 11/586,528

(22) Filed: Oct. 26, 2006

(65) Prior Publication Data
US 2008/0188055 A1    Aug. 7, 2008

(51) Int. Cl.
*H01L 29/94* (2006.01)
(52) U.S. Cl. .................... 438/386; 438/243; 257/301; 257/E29.346
(58) Field of Classification Search ............ 438/386, 438/243; 257/301, E29.346
See application file for complete search history.

(56) References Cited

U.S. PATENT DOCUMENTS

| | | | |
|---|---|---|---|
| 5,963,835 A * | 10/1999 | Sandhu et al. | 438/681 |
| 6,734,053 B2 | 5/2004 | Liu et al. | |
| 6,753,618 B2 * | 6/2004 | Basceri et al. | 257/296 |
| 7,101,806 B2 * | 9/2006 | Cline et al. | 438/724 |
| 2005/0023640 A1 * | 2/2005 | Choi et al. | 257/532 |
| 2006/0128108 A1 * | 6/2006 | Kim et al. | 438/381 |

* cited by examiner

*Primary Examiner*—Steven J Fulk
(74) *Attorney, Agent, or Firm*—Thomas, Kayden, Horstemeyer & Risley

(57) ABSTRACT

A method of manufacturing a semiconductor device includes forming a metal-insulator-metal (MIM) device having a metal organic chemical vapor deposited (MOCVD) lower electrode and an atomic layer deposited (ALD) upper electrode.

10 Claims, 3 Drawing Sheets

METHOD OF FORMING METAL-INSULATOR-METAL STRUCTURE

TECHNICAL FIELD

The present invention generally relates to a semiconductor device and a method of making a semiconductor device. More particularly, this invention relates to semiconductor devices including metal-insulator-metal (MIM) structures, and methods for manufacturing such structures.

DESCRIPTION OF THE RELATED ART

Metal-insulator-metal (MIM) fabrication technology is widely used in the fabrication of semiconductor integrated circuit devices. MIM capacitors, for example, are commonly utilized in high performance applications of CMOS technology. A typical MIM capacitor possesses a sandwich-like structure that can generally be described as a plate capacitor. The capacitor upper electrode is separated from the bottom electrode by an electrically insulating (e.g., dielectric) layer.

MIM capacitors are generally utilized in semiconductor devices, such as integrated circuits (ICs) having dynamic random access memory (DRAM) cells, for storing an electrical charge. MIM capacitors can be formed in trenches utilizing damascene fabrication technology, which is well known in the semiconductor fabrication art.

Typically, atomic layer deposition (ALD) and metal organic chemical vapor deposition (MOCVD) of metal nitride layers have been used to form the electrode materials in MIM capacitors. While ALD can lead to better electrical properties of as-deposited metal nitride films, the manufacturing throughput of ALD metal nitride films is limited and can negatively impact the mass production requirements of ICs. On the other hand, while MOCVD metal nitride has a higher throughput compared to ALD metal nitride, the electrical properties of as-deposited MOCVD metal nitride electrode films are not as good as those deposited by ALD.

Further, if MOCVD metal nitride is deposited, a plasma treatment is required to remove impurities introduced during the deposition process. This plasma treatment can damage the underlying dielectric layer when performed on the top electrode. In addition, the plasma treatment is anisotropic, and does not adequately remove contamination from the metal nitride deposited along the sidewalls of a trench-type MIM capacitor. Remaining contamination can cause high leakage current in the MIM capacitor, which requires the presence of a thicker dielectric layer between the capacitor electrodes. This can, in turn, affect the ability to scale down the size of MIM capacitors. Therefore, the top electrode is typically formed by ALD metal nitride, because it is not subject to the contamination caused by the MOCVD process and use of ALD therefore obviates the need for plasma treatment of the top electrode. However, since ALD throughput is low, it is not feasible to use ALD for both the top and bottom electrodes. Thus, a tradeoff exists between ALD metal nitride and MOCVD metal nitride in the application of electrode materials to MIM capacitors.

Therefore, in order to increase throughput and maintain the electrical properties MIM capacitors, there is a need for an improved MIM structure and a method for producing the same. The present invention is directed to satisfying this need.

SUMMARY OF THE INVENTION

In accordance with the purpose of the invention as embodied and broadly described, there is provided a method of manufacturing a semiconductor device, comprising: providing a substrate; forming a trench in the substrate; forming a first conductive layer in the trench; performing rapid thermal processing of the first conductive layer; forming an insulator layer over the first conductive layer; and forming a second conductive layer on the insulator layer.

In accordance with the present invention, there is also provided a method of manufacturing a semiconductor device, comprising: providing a substrate; providing a bottom anti-reflective coating (BARC) layer over the substrate; forming a photoresist layer over the BARC layer; patterning the photoresist layer to form a photoresist mask including an opening for a trench to be formed in the substrate; etching the BARC layer and the photoresist layer through the openings in the photoresist mask to expose a portion of the substrate; etching the exposed portion of the substrate to form the trench in the substrate; forming a first conductive layer in the trench by metal organic chemical vapor deposition (MOCVD); performing chemical mechanical polishing (CMP); performing rapid thermal processing of the first conductive layer; forming an insulator layer over the conductive layer; and forming a second conductive layer on the insulator layer by atomic layer deposition (ALD).

Additional features and advantages of the invention will be set forth in the description that follows, being apparent from the description or learned by practice of the invention. The features and other advantages of the invention will be realized and attained by the semiconductor device structures and methods of manufacture particularly pointed out in the written description and claims, as well as the appended drawings.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DESCRIPTION OF THE EMBODIMENTS

Reference will now be made in detail to embodiments of the present invention, examples of which are illustrated in the accompanying drawings. Wherever possible, the same or similar reference numbers will be used throughout the drawings to refer to the same or like parts.

Embodiments consistent with the present invention provide for a semiconductor device, including a MIM capacitor, and a method of manufacturing a semiconductor device that enables increased throughput and improved electrical properties of a MIM capacitor. To overcome drawbacks associated with the approaches in the related art discussed above, and consistent with an aspect of the present invention, a semiconductor device and its method of manufacture will next be described.

Embodiments consistent with the present invention include devices having a MIM capacitor and methods for forming the MIM capacitor. FIGS. 1-4 illustrate an embodiment for making such a device having a MIM capacitor.

Figure 1:
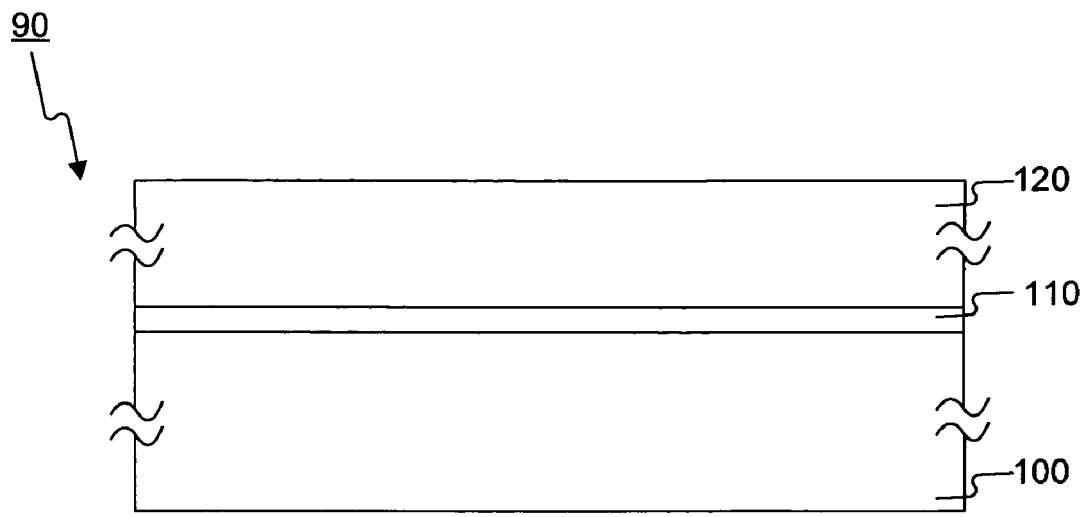
FIGS. 1-4 illustrate formation steps of forming a MIM capacitor structure according to an embodiment of the present invention.

With reference to FIG. 1, a wafer 90 is provided, comprising a substrate 100, for example silicon, which will undergo processing to form predetermined active regions and passive regions (not shown). For simplicity, transistors present in the active regions in the substrate below the MIM capacitor structure, passive regions between active regions in the substrate, and bit and word lines above the MIM capacitor structure, are not shown. Substrate 100 may be a single-crystal silicon wafer, and may have a (100) orientation. A bottom anti-reflective coating (BARC) 110 is formed on substrate 100, followed by forming a photoresist layer 120 on BARC 110. BARC 110 and photoresist layer 120 may be formed by known techniques.

Figure 2A:
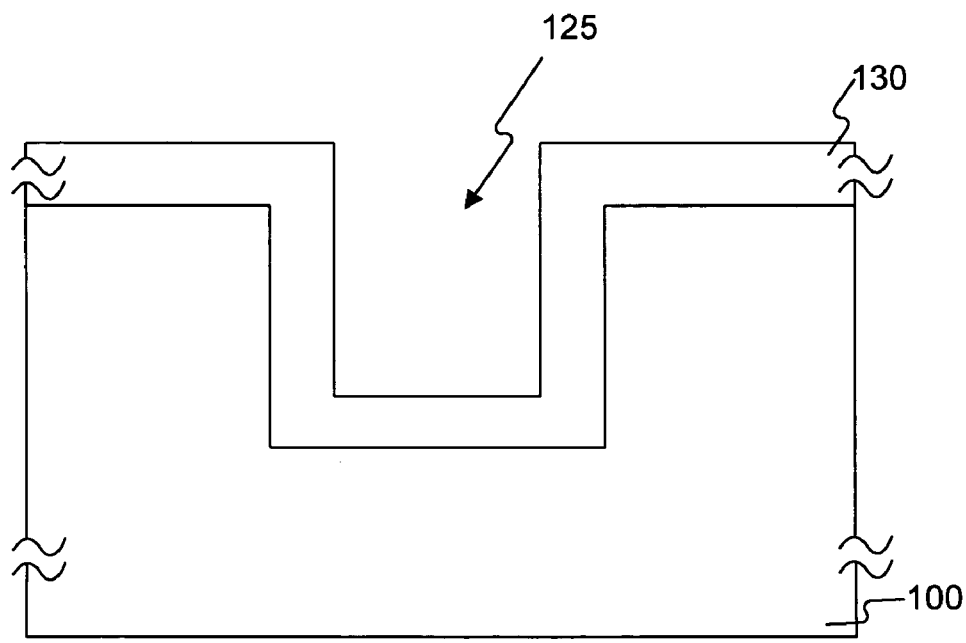

Photoresist layer 120 may also be patterned by known techniques, such as optical projection lithography, and substrate 100 then etched to form a trench 125 in substrate 100, as shown in FIG. 2A. After formation of trench 125, a metal organic chemical vapor deposition (MOCVD) process is used to form a lower metal nitride layer 130. Metal nitride layer 130 serves as the bottom electrode, or bottom plate, of the MIM capacitor. Preferably, metal nitride layer 130 is TiN.

Consistent with the invention, the metal nitride layer 130 may be formed by employing multiple sequential MOCVD deposition steps (not shown). For example, metal nitride layer 130 may be formed by multiple separate MOCVD deposition steps. In one example, up to eight separate deposition steps may be performed, with each step depositing approximately 25 Å of metal nitride. Alternatively, in another example, metal nitride layer 130 may be formed by five separate MOCVD deposition steps, each step depositing approximately 50 Å of metal nitride. Between each of the MOCVD deposition steps, metal nitride layer 130 is subjected to a plasma treatment (not shown) to remove and/or reduce contamination caused by the precursor gases used during the MOCVD process. For example, when metal nitride layer 130 is TiN, the MOCVD process uses TDMAT (tetrakis[dimethylamido]-Ti)(Ti(N[CH$_3$]$_2$)$_4$) reacted with NH$_3$ to produce TiN at about 400° C. Contamination of the as-deposited TiN caused by the MOCVD process is due to the individual components of the reactant gases. For example, carbon contamination of the as-deposited TiN may result.

As mentioned above, the plasma treatment (not shown) is used to remove contamination in metal nitride layer 130. The contaminant most detrimental to MIM capacitor performance is carbon. This is because the presence of carbon will increase the leakage current in the MIM capacitor, degrading its charge storing capacity. In addition, the presence of oxygen in a subsequently deposited oxide layer may react with the carbon contamination, thereby depleting the amount of oxygen in the oxide layer, leading to current leakage. The plasma treatment may be performed with an N$_2$/H$_2$ plasma, which can reduce and/or remove the carbon contamination.

The plasma treatment used to remove C contamination between the multiple MOCVD deposition steps is anisotropic, that is, it removes C contamination preferentially in one direction. In this case, the plasma treatment more effectively removes C contamination from the bottom portion of metal nitride layer 130 inside trench 125, and is less effective at removing C contamination along the sidewalls of metal nitride layer 130 inside trench 125.

Figure 2B:
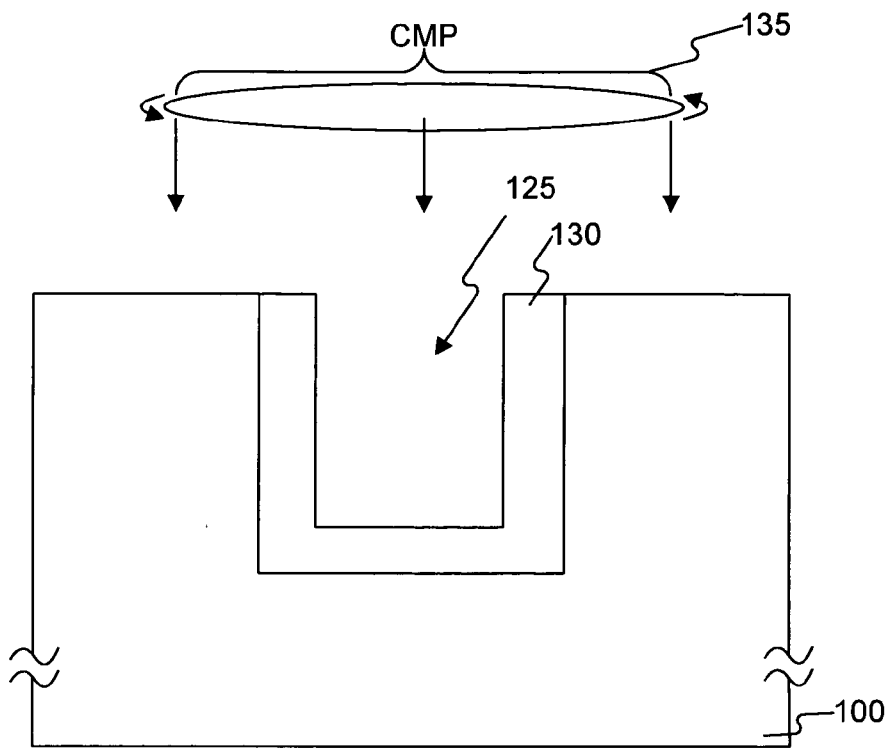

After formation of metal nitride layer 130, wafer 90, at this point comprising substrate 100 and metal nitride layer 130, is subjected chemical mechanical polishing (CMP) 135, shown in FIG. 2B, to remove portions of metal nitride layer 130 from regions other than inside trench 125.

Figure 2C:
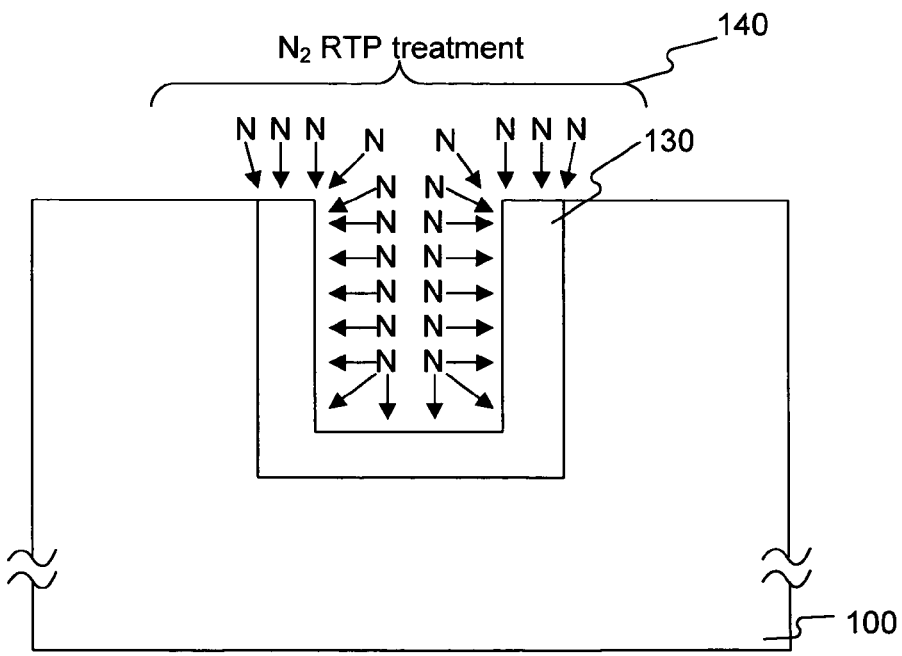

Next, as shown in FIG. 2C, metal nitride layer 130 is subjected to a rapid thermal processing (RTP) treatment 140, in a nitrogen (N$_2$) atmosphere. RTP treatment 140 may be carried out at a temperature of about 500° C. to about 720° C. for about 30 seconds to about 120 seconds. Preferably, RTP treatment 140 is carried out at a temperature of about 690° C. for about 60 seconds. Benefits of RTP treatment 140, over other furnace-based heat treatments, include reduced processing time, reduced thermal budget (i.e., total amount of heat energy expended), better control of processing conditions, and reduced damage to other already-fabricated portions of the semiconductor device being processed. RTP treatment 140 will improve the purity and quality of metal nitride layer 130, by quickly driving out contamination without allowing time for impurities to diffuse deeper into the rest of the semiconductor device. Preferably, RTP treatment 140 is carried out in addition to the plasma treatment described earlier, since the combination of a plasma treatment and RTP treatment 140 can lead to better electrical properties of a resulting MIM capacitor. For example, if metal nitride layer 130 is TiN, RTP treatment 140 greatly reduces carbon contamination in the as-deposited MOCVD TiN film. The process by which this occurs is a result of the presence of N$_2$ as a reductive gas in that it decomposes and reacts with the TDMAT to produce TiN. The mechanism is similar to that occurring in a plasma treatment, though the plasma treatment is anisotropic, in contrast to the isotropic nature of the RTP treatment 140.

Figure 3:
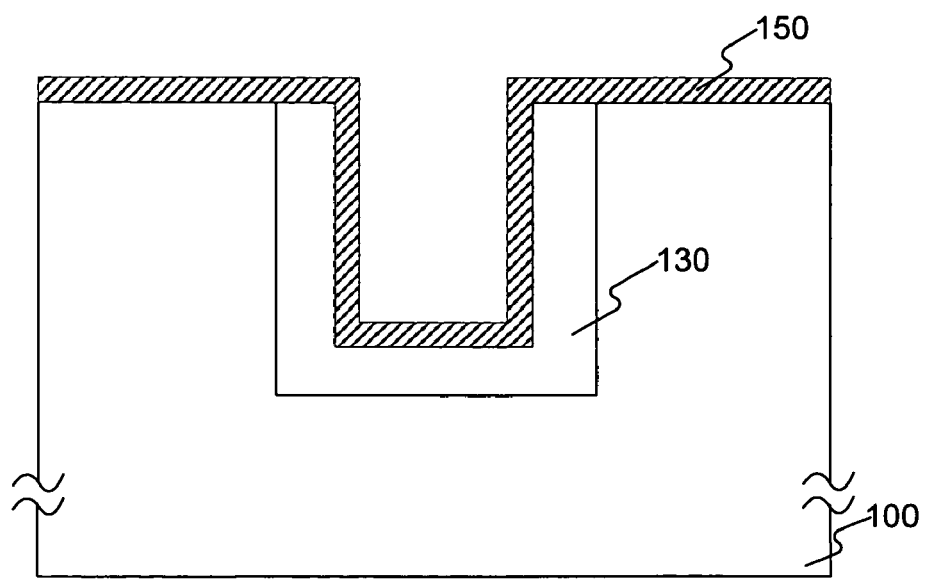
Figure 4:
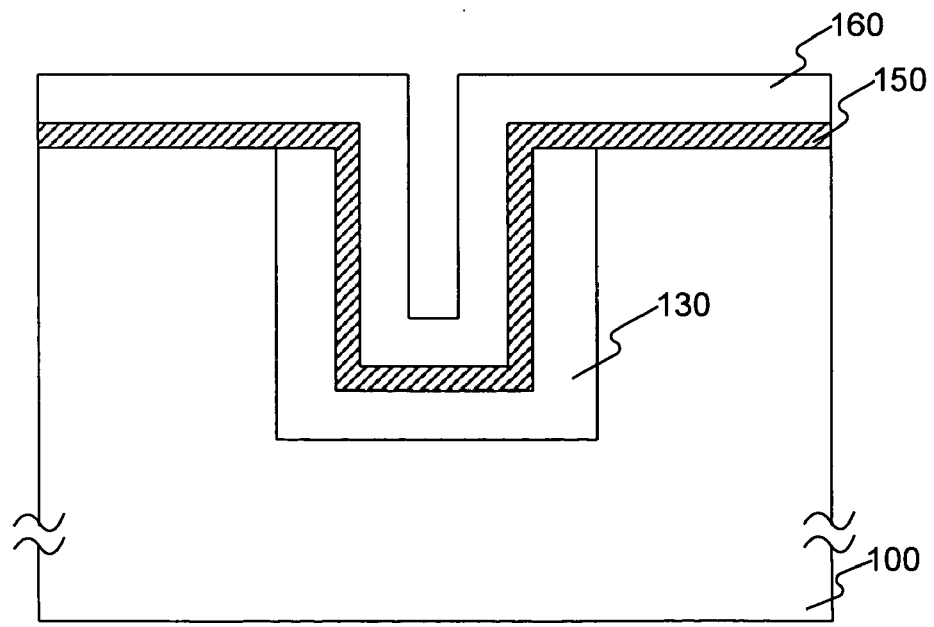

Next, as shown in FIG. 3, a high dielectric constant (i.e., "high-k") insulator layer 150 is deposited on substrate 100 and metal nitride layer 130 inside trench 125. Preferably, insulator layer 150 is a metal oxide, such as alumina (Al$_2$O$_3$). Insulator layer 150 can be deposited by known techniques, such as low-pressure chemical vapor deposition (LPCVD), using silane or tetraethylorthosilicate (TEOS) (Si(OC$_2$H$_5$)$_4$) as reactant gases in the LPCVD process. Preferably, insulator layer 150 is deposited by atomic layer deposition (ALD). For example, as-deposited insulator layer 150 may be about 45 Å to about 50 Å thick, and have a dielectric constant (k) from about 8 to about 10.

After formation of insulator layer 150, MIM capacitor formation is completed by using an ALD process to form an upper metal nitride layer 160. Metal nitride layer 160 may be any metal nitride, preferably titanium nitride (TiN). Metal nitride layer 160 serves as the upper electrode, or top plate, of the MIM capacitor. Preferably, metal nitride layer 160 is about 150 Å to about 350 Å thick. The ALD process used to form metal nitride layer 160 includes reacting a metal, preferably Ti, with NH$_3$ during several deposition cycles. Each deposition cycle can form approximately 0.8 Å of metal nitride. Thus, for example, 250 deposition cycles will form 200 Å of metal nitride. Next, experimental results of MIM capacitor structures based on the above-described formation method will be described.

Cross-sectional transmission electron microscopy (TEM) was performed to assess the structure of a MIM capacitor fabricated without RTP. A 200 keV field emission TEM was used with semi-quantitative electron energy loss spectroscopy (EELS) analytical capability. The results of the TEM analysis showed the striated layers of TiN due to multiple MOCVD steps, the amorphous nature of alumina insulator layer, and the polycrystalline nature of the ALD TiN layer. Electron energy loss spectroscopy (EELS) data indicated the presence and location of carbon in the MIM capacitor structure. For the MIM capacitor fabricated without RTP, the inventors observed that there was a significant amount of carbon located along the region corresponding to the lower metal nitride layer. Additional EELS data indicated the presence and location of oxygen. The inventors observed that there is a narrow intensity band of oxygen along the region corresponding to the lower metal nitride layer/insulator layer interface.

For comparison, additional cross-sectional TEM microscopy was performed to assess the structure of a MIM capacitor fabricated with RTP. A 200 keV field emission TEM was used with semi-quantitative electron energy loss spectroscopy (EELS) analytical capability. The MIM capacitor used in this analysis was fabricated according to the steps described with respect to FIGS. 1-4. That is, a portion of the MIM capacitor was subject to an RTP treatment of the lower metal nitride layer. The TEM analysis revealed a partially crystallized portion of the MOCVD TiN layer corresponding to the lower metal nitride layer. The inventors have observed that the RTP treatment essentially recrystallizes a portion of the MOCVD TiN layer. This is advantageous in that it improves the electrical properties of the capacitor lower electrode, e.g., it reduces the current leakage at the insulator/electrode interface (e.g., the $Al_2O_3$/TiN interface) and increases the breakdown voltage (which is proportional to the life of a MIM capacitor), by reduction of carbon contamination.

For the MIM capacitor fabricated with RTP, EELS data also indicated the presence and location of carbon. The inventors observed a greatly reduced amount of carbon located along the region corresponding to the lower metal nitride layer, in comparison to the MIM capacitor fabricated without RTP. This demonstrates the reduction in carbon contamination achieved by the RTP of lower metal nitride layer consistent with the invention.

Similarly, for the MIM capacitor fabricated with RTP, EELS data also indicated the presence and location of oxygen. The inventors observed a much wider intensity band of oxygen along the region corresponding to the lower metal nitride layer/insulator layer interface, in contrast to the amount of oxygen observed in the MIM capacitor fabricated without RTP. The difference between the narrow band of oxygen observed for the MIM capacitor fabricated without RTP and the MIM capacitor fabricated with RTP, implies that oxygen in the oxide layer might react with carbon contamination in the metal nitride layer. As the oxygen in the oxide layer reacts with carbon in the metal nitride layer, it will degenerate the film quality of the oxide layer, and may degrade electrical properties of the resulting MIM capacitor.

It will be apparent to those skilled in the art that various modifications and variations can be made in the disclosed structures and methods without departing from the scope or spirit of the invention. Other embodiments of the invention will be apparent to those skilled in the art from consideration of the specification and practice of the invention disclosed herein. It is intended that the specification and examples be considered exemplary only, with a true scope and spirit of the invention being indicated by the following claims.

What is claimed is:

1. A method of manufacturing a semiconductor device, comprising:
   providing a substrate;
   forming a trench in the substrate;
   forming a first conductive layer in the trench by multiple separate metal organic chemical vapor deposition (MOCVD) deposition steps, wherein each of the MOCVD deposition steps forms a metal nitride layer and the metal nitride layer is subjected to a plasma treatment between each of the deposition steps;
   performing rapid thermal processing of the first conductive layer;
   forming an insulator layer over the first conductive layer; and
   forming a second conductive layer on the insulator layer.

2. The method of manufacturing a semiconductor device according to claim 1, wherein the rapid thermal processing is carried out at a temperature of from about 500° C. to about 720° C. for about 30 seconds to about 120 seconds, and forming the insulator layer includes depositing a high-k dielectric material having a dielectric constant of about 8 to about 10.

3. The method of manufacturing a semiconductor device according to claim 1, wherein the insulator layer is formed by depositing a metal oxide.

4. The method of manufacturing a semiconductor device according to claim 1, further comprising forming the second conductive layer by atomic layer deposition of a metal nitride.

5. The method of manufacturing a semiconductor device according to claim 1, wherein the semiconductor device being manufactured comprises a metal-insulator-metal capacitor.

6. A method of manufacturing a semiconductor device, comprising:
   providing a substrate;
   providing a bottom anti-reflective coating (BARC) layer over the substrate;
   forming a photoresist layer over the BARC layer;
   patterning the photoresist layer to form a photoresist mask including an opening for a trench to be formed in the substrate;
   etching the BARC layer and the photoresist layer through the openings in the photoresist mask to expose a portion of the substrate;
   etching the exposed portion of the substrate to form the trench in the substrate;
   forming a first conductive layer in the trench by multiple separate metal organic chemical vapor deposition (MOCVD) deposition steps, wherein each of the MOCVD deposition steps forms a metal nitride layer and the metal nitride layer is subjected to a plasma treatment between each of the deposition steps;
   performing chemical mechanical polishing;
   performing rapid thermal processing of the first conductive layer;
   forming an insulator layer over the conductive layer; and
   forming a second conductive layer on the insulator layer by atomic layer deposition.

7. The method of manufacturing a semiconductor device according to claim 6, wherein the rapid thermal processing is carried out at a temperature of from about 500° C. to about 720° C. for about 30 seconds to about 120 seconds, and forming the insulator layer includes depositing a high-k dielectric material having a dielectric constant of about 8 to about 10.

8. The method of manufacturing a semiconductor device according to claim 6, wherein the insulator layer is formed by depositing a metal oxide.

9. The method of manufacturing a semiconductor device according to claim 6, further comprising forming the second conductive layer by atomic layer deposition of a metal nitride.

10. The method of manufacturing a semiconductor device according to claim 6, wherein the semiconductor device being manufactured comprises a metal-insulator-metal capacitor.

* * * * *